(12) United States Patent
Lu et al.

(10) Patent No.: US 6,969,651 B1
(45) Date of Patent: Nov. 29, 2005

(54) LAYOUT DESIGN AND PROCESS TO FORM NANOTUBE CELL FOR NANOTUBE MEMORY APPLICATIONS

(75) Inventors: Hongqiang Lu, Lake Oswego, OR (US); William Barth, Gresham, OR (US); Peter A. Burke, Portland, OR (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/810,760

(22) Filed: Mar. 26, 2004

(51) Int. Cl.[7] ............................................. H01L 21/336
(52) U.S. Cl. ...................... 438/257; 438/592; 438/690; 365/151
(58) Field of Search .......................... 438/99, 242, 243, 438/257, 386, 592, 690; 365/151, 153, 158, 365/171, 176

(56) References Cited

U.S. PATENT DOCUMENTS

| | | | |
|---|---|---|---|
| 6,643,165 B2 | 11/2003 | Segal et al. | 365/151 |
| 6,706,402 B2 * | 3/2004 | Rueckes et al. | 428/408 |
| 6,734,087 B2 * | 5/2004 | Hidaka et al. | 438/584 |

* cited by examiner

*Primary Examiner*—Phuc T. Dang
(74) *Attorney, Agent, or Firm*—Beyer Weaver Thomas

(57) ABSTRACT

Nanotube memory cells are formed on a semiconductor substrate. Lower and upper memory cell chambers are formed by forming a first trench overlying the first and second contacts in a nitride layer, forming a second trench overlying the first and second contacts in a dielectric layer, depositing a nitride layer on the combined lower and upper chambers, and patterning the nitride layer to form an access hole to the nanotube layer and a second access hole to the second contact. A conductive layer is then deposited and patterned to form a top electrode contact and a nanotube layer contact. The conductive material closes the aperture created by the access hole.

17 Claims, 6 Drawing Sheets

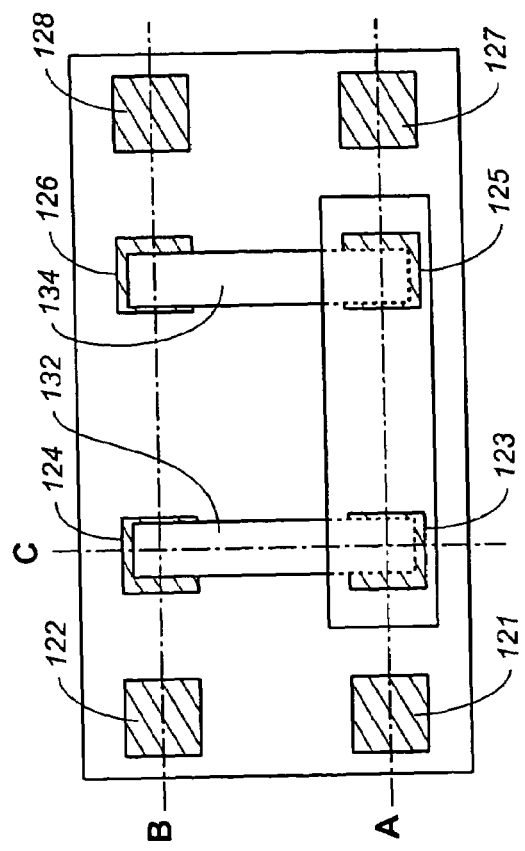
FIG._1A
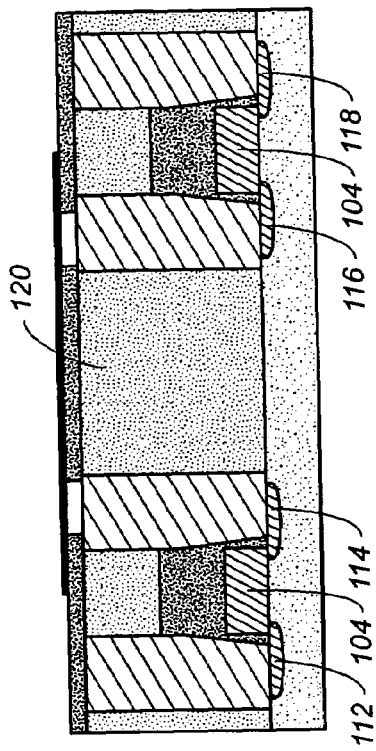
FIG._1C
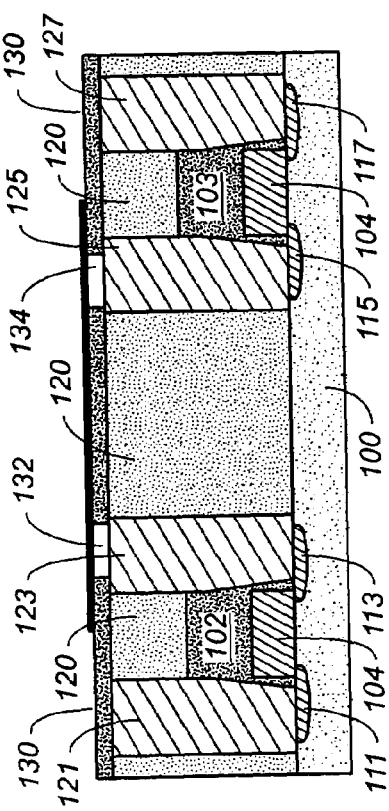
FIG._1B
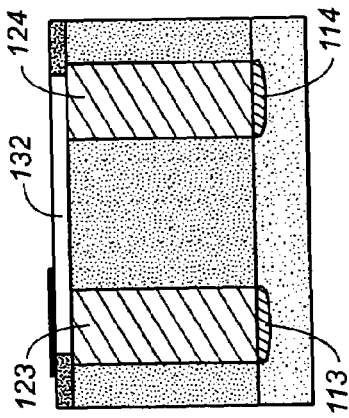
FIG._1D

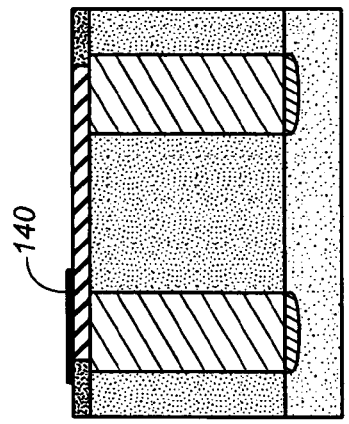
FIG._2C
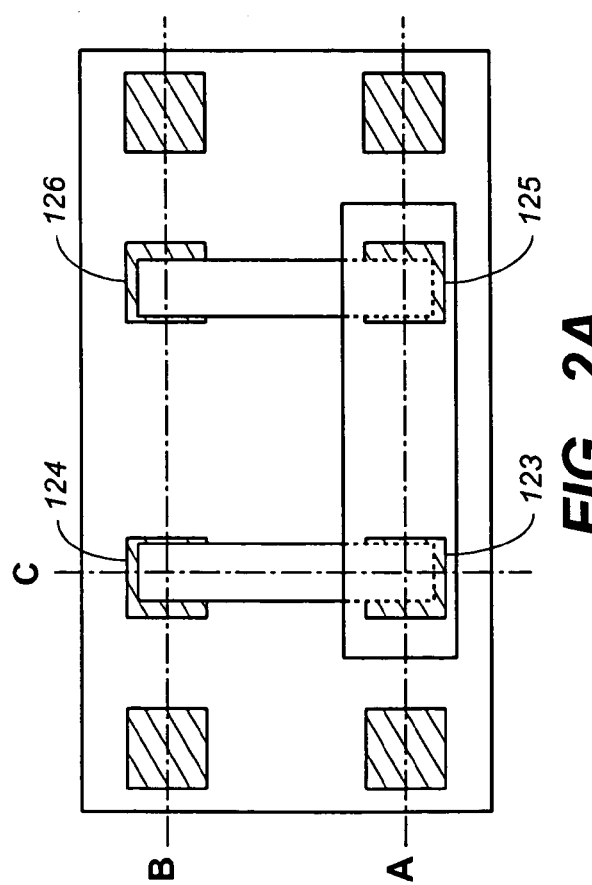
FIG._2A
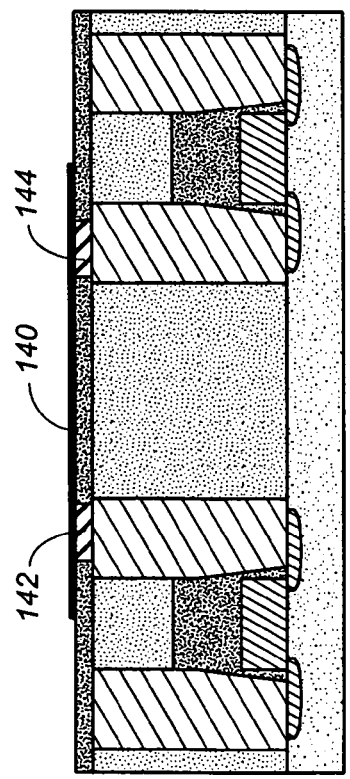
FIG._2B

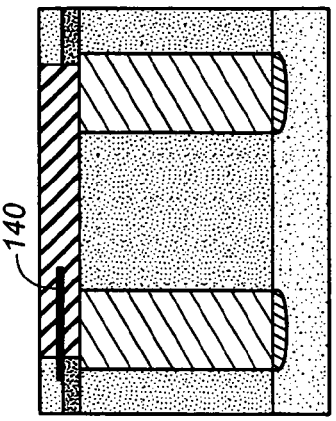
FIG._3C
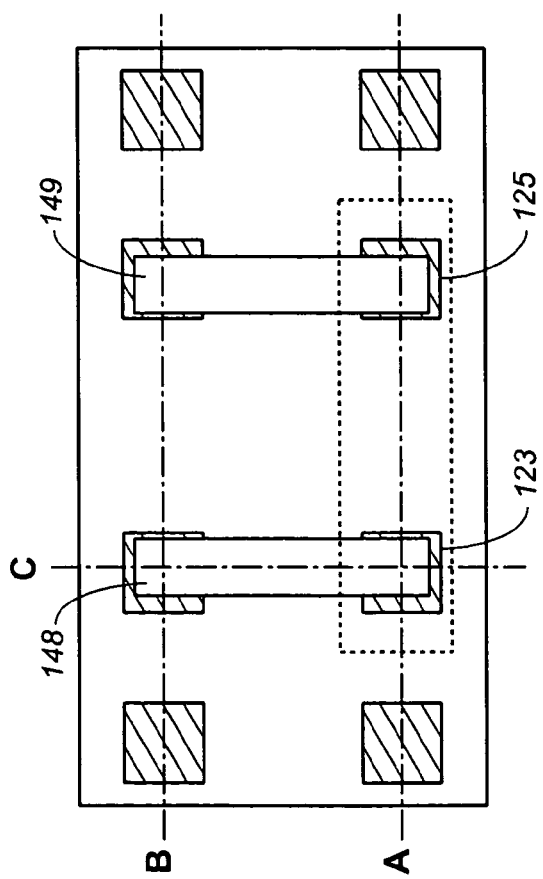
FIG._3A
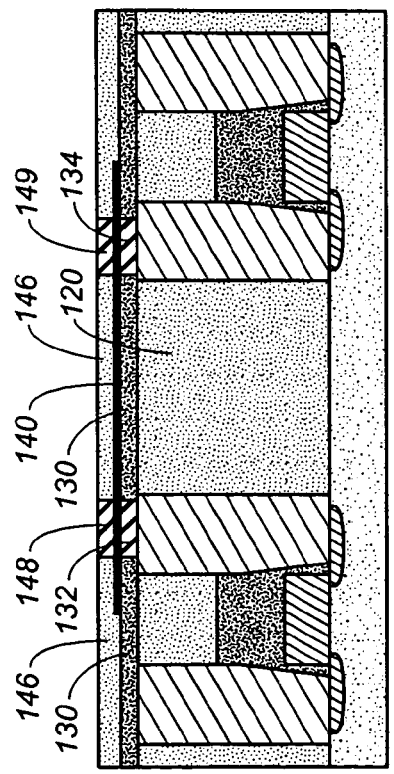
FIG._3B

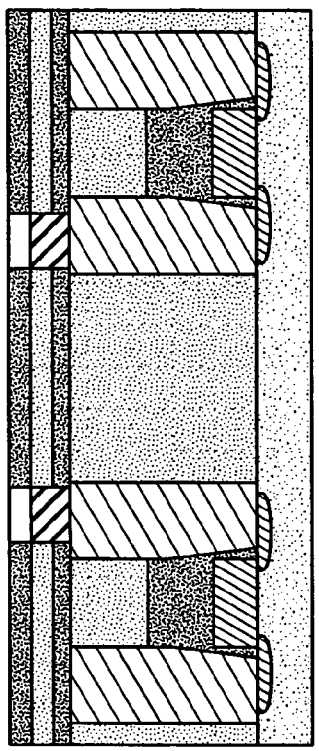
FIG._4D
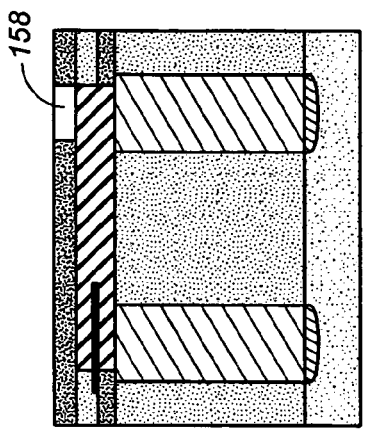
FIG._4C
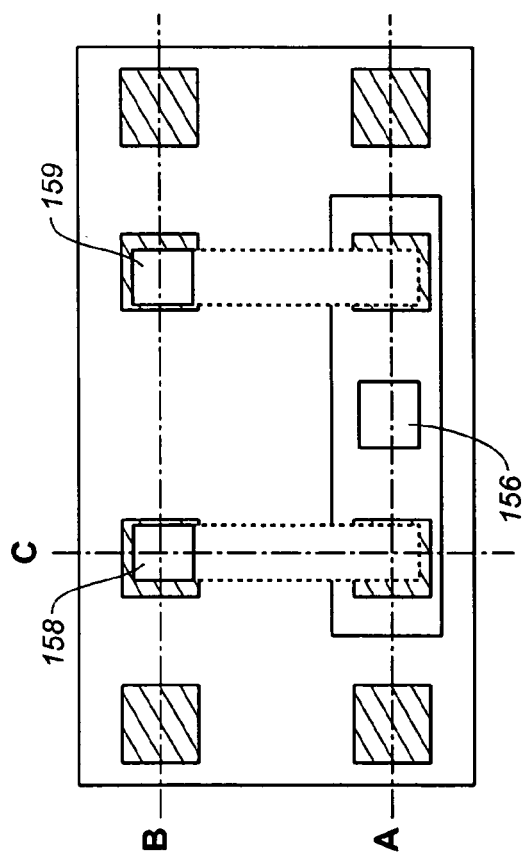
FIG._4A
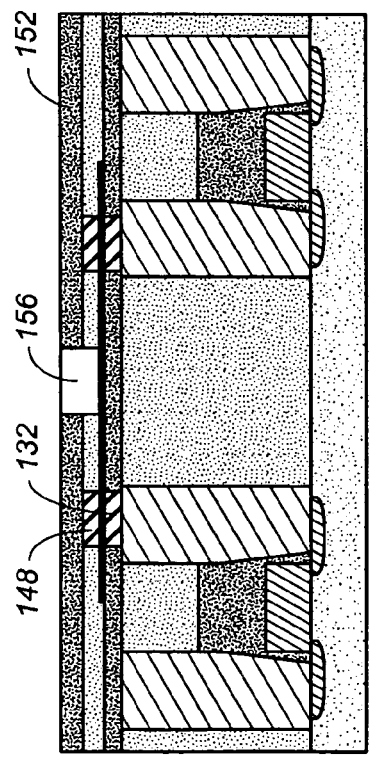
FIG._4B

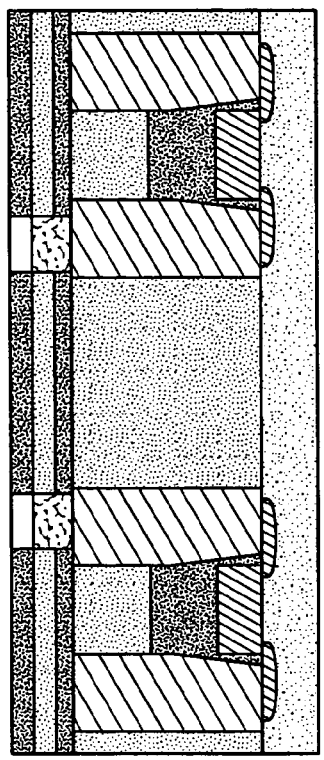
FIG._5D
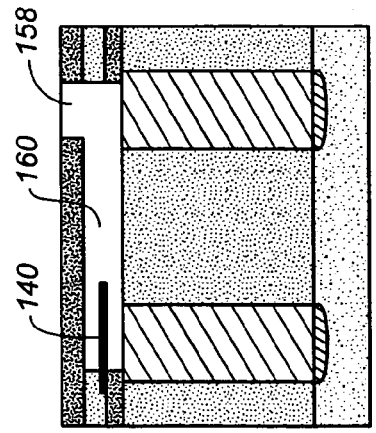
FIG._5C
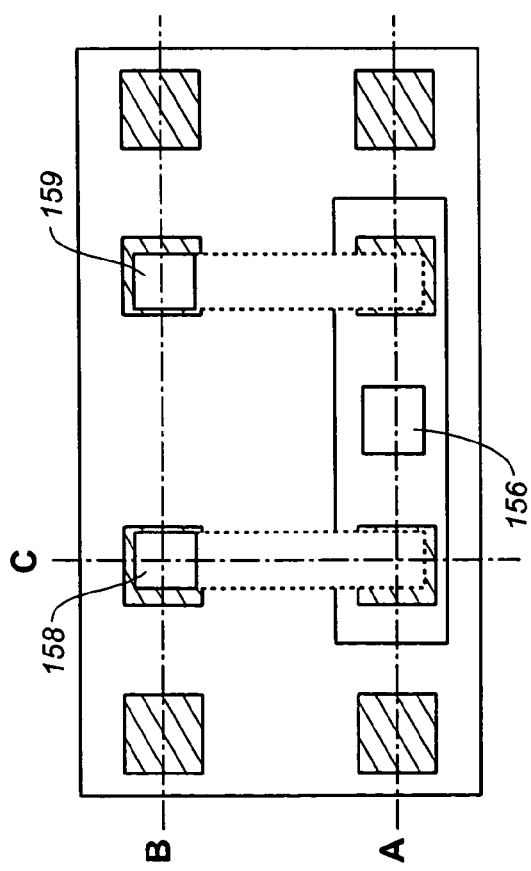
FIG._5A
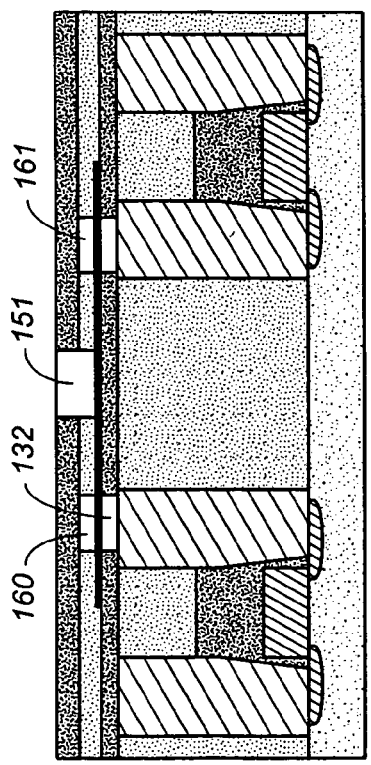
FIG._5B

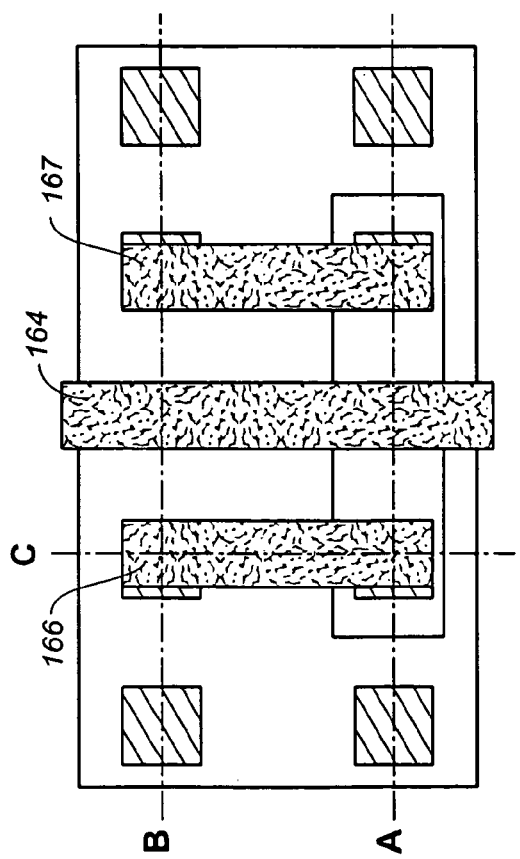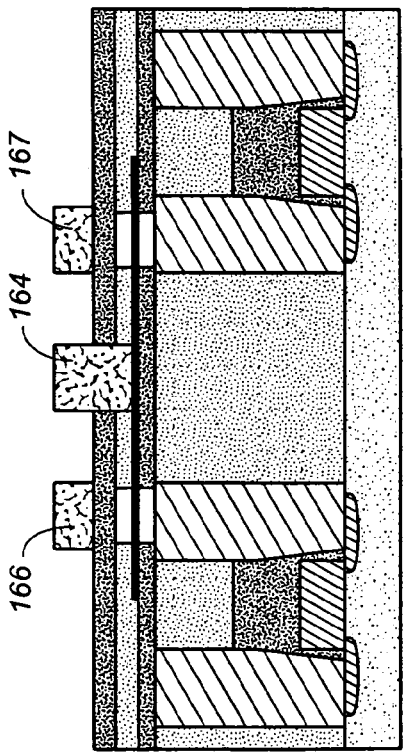
FIG._6A
FIG._6B
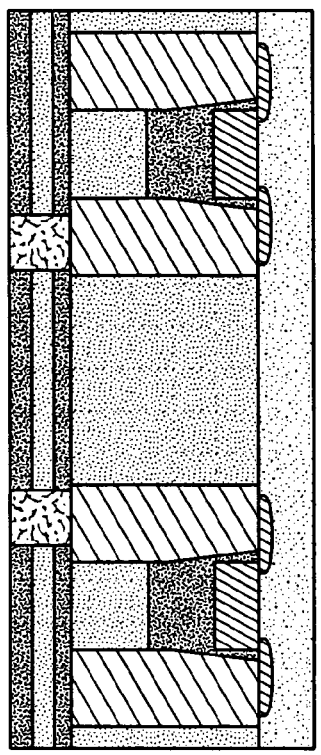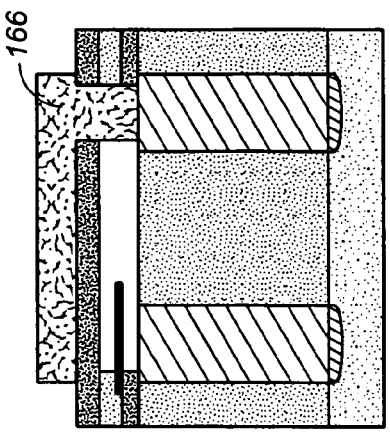
FIG._6D
FIG._6C

LAYOUT DESIGN AND PROCESS TO FORM NANOTUBE CELL FOR NANOTUBE MEMORY APPLICATIONS

BACKGROUND OF THE INVENTION

1. Field of the Invention

The present invention relates to methods for forming semiconductor devices. More particularly, the present invention relates to methods for integrating nanotube memory cells in the semiconductor integrated circuit formation process.

2. Description of the Related Art

Designers and semiconductor device manufacturers constantly strive to develop smaller devices from wafers, recognizing that circuits with smaller features generally produce greater speeds and increased packing density, therefore increased net die per wafer (numbers of usable chips produced from a standard semiconductor wafer). These trends apply equally to memory devices. It is generally desirable for nonvolatile memory devices used in integrated circuits to have low cost, low power, high density, and high speed attributes. Conventional memory technology such as used in ROM are available at relatively low cost but can be programmed only once. DRAM memory devices rely on charged transistor gates but require separate circuitry to refresh the memory hundreds of times per second. Combining the advantages of each has been a goal of memory manufacturers. That is, a desirable memory device would provide access speeds equal to or greater than random-access memory (RAM) chips that are currently used for frequently accessed memory as well as the ability to store information even without power.

One promising technology uses carbon nanotubes to form a controllable switch. Carbon nanotubes are formed from a cylindrical array of carbon atoms whose diameter is only about 1 nm. Memory arrays using carbon nanotubes as the active conducting element in electromechanical switches have been proposed, for example, by Nantero, Ltd. of Woburn, Mass.

One integration process currently proposed requires the formation of an empty chamber to allow movement of a nanotube switch element. Unfortunately, formation of these chambers requires creating a pathway for removing a sacrificial material then filling this pathway without damaging either the nanotubes or metal electrodes.

Moreover, filling the chambers must be avoided during subsequent steps. Current methods either require precise process control or are unreliable. Moreover, the steps in the process flow should be compatible with the current CMOS manufacturing environment.

Accordingly, what is needed is an improved process for forming nanotube memory cells having greater compatibility with conventional CMOS flow steps. In particular, it is desirable to provide a simplified process flow for forming nanotube memory cells in which the memory cells are reliably formed.

SUMMARY OF THE INVENTION

To achieve the foregoing, the present invention provides a method of integrating nanotube memory cells in the semiconductor integrated circuit formation process. The processing sequence involves forming an upper and lower chamber on a substrate. Initially, formation of the lower chamber commences by etching a short trench in a nitride layer the trench overlying a pair of contacts, each of the contacts connected to a diffusion area in the substrate. The trench is then filled with Si by sputtering (or Si LPCVD Deposition) and planarized. A nanotube ribbon is then formed on the filled silicon trench.

Next, formation of the upper chamber commences with the formation of an oxide layer on the surface of the partially formed device. A second trench is etched into the oxide layer, the second trench overlapping the first trench. The second trench is then filled with Si and is planarized by Si CMP process. A thin nitride layer is deposited. A hole is opened in the nitride layer over one of the contacts in the pair with the nitride layer remaining to cover the second contact in the pair. Next an etch is performed using tetramethyl ammonium hydroxide (TMAH) to remove the silicon over both contacts, i.e., in the entire trench. This results in the formation of the nanotube chamber. Finally, a Ti/TiN/Al/TiN stack is deposited. Since the openings in the nanotube chamber are shallow, electrical contact with the underlying W contact is made and complete filling of the nanotube chamber avoided. The process completes with the deposition of a passivation layer over the patterned aluminum layer. By forming the nanotube chamber in this manner, a method of forming nanotubes that is compatible with CMOS processes results. Using the configuration and steps described, the nanotube chamber may be reliably closed without concern as to unintended filling of the chamber.

According to one embodiment, a method of forming nanotube memory cells in a semiconductor integrated circuit is provided. A first dielectric filled chamber is formed such that the chamber overlies a first and second contact. Each of these contacts is electrically connected to diffusion areas in the silicon substrate. A nanotube layer is then formed on the first silicon filled chamber, the nanotube layer overlying the first contact and not overlying the second contact. A second silicon filled chamber is then formed directly on the nanotube layer. A dielectric layer such as a nitride layer is then formed on the second silicon filled chamber. The nitride layer is then patterned to form an access opening overlying the second contact and exposing the second silicon filled chamber. The first and second silicon filled chambers are then evacuated by etching through the access opening to remove the silicon. Finally, a conductive material is deposited on the nitride layer and into the access opening such that the conductive material makes contact with the second contact and closes the access opening, thereby sealing the first and second chambers.

These and other features and advantages of the present invention are described below with reference to the drawings.

BRIEF DESCRIPTION OF THE DRAWINGS

FIGS. 1–5 are diagrams illustrating stages in the formation of a nanotube memory cell in accordance with one embodiment of the present invention. Each of FIGS. 1–5 shows a top plan layout and one or more sectional elevations corresponding to the respective stage of the process.

FIG. 1A is a top diagrammatic plan view illustrating a stage in the formation of a nanotube memory cell in accordance with one embodiment of the present invention.

FIGS. 1B–1D are cross sectional views illustrating the process stage of FIG. 1A, taken along lines A, B, and C respectively in FIG. 1A.

FIG. 2A is a top diagrammatic plan view illustrating another stage in the formation of a nanotube memory cell in accordance with one embodiment of the present invention.

FIGS. 2B–2C are cross sectional views illustrating the process stage of FIG. 2A, taken along lines A and C respectively in FIG. 2A.

FIG. 3A is a top diagrammatic plan view illustrating another stage in the formation of a nanotube memory cell in accordance with one embodiment of the present invention.

FIGS. 3B–3C are cross sectional views illustrating the process stage of FIG. 3A, taken along lines A and C respectively in FIG. 3A.

FIG. 4A is a top diagrammatic plan view illustrating another stage in the formation of a nanotube memory cell in accordance with one embodiment of the present invention.

FIGS. 4B–4D are cross sectional views illustrating the process stage of FIG. 4A, taken along lines A, B, and C respectively in FIG. 4A, each formed in accordance with one embodiment of the present invention.

FIG. 5A is a top diagrammatic plan view illustrating another stage in the formation of a nanotube memory cell in accordance with one embodiment of the present invention.

FIGS. 5B–5D are cross sectional views illustrating the process stage of FIG. 5A, taken along lines A, B, and C respectively in FIG. 5A, each formed in accordance with one embodiment of the present invention.

FIG. 6A is a top diagrammatic plan view illustrating another stage in the formation of a nanotube memory cell in accordance with one embodiment of the present invention.

FIGS. 6B–6D are cross sectional views illustrating the process stage of FIG. 6A, taken along lines A, B, and C respectively in FIG. 6A, each formed in accordance with one embodiment of the present invention.

DETAILED DESCRIPTION OF PREFERRED EMBODIMENTS

Reference will now be made in detail to preferred embodiments of the invention. Examples of the preferred embodiments are illustrated in the accompanying drawings. While the invention will be described in conjunction with these preferred embodiments, it will be understood that it is not intended to limit the invention to such preferred embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

The present invention provides methods for forming memory arrays using carbon nanotubes as the active conducting element in electromechanical switches. Nantero, Ltd. of Woburn, Mass. has proposed the use of nanotube memory cells in a memory array, particularly using nanotube ribbons. The operation of nanotube memory cells and the configuration of nanotube ribbons has been described in detail in U.S. Pat. No. 6,643,165, entitled "Electromechanical Memory Having Cell Selection Circuitry Constructed with Nanotube Technology", by Segal et al. and assigned to Nantero, Inc. The application is hereby incorporated by reference in its entirety to further illustrate details as to an exemplary configuration and operation of nanotube memory cells.

Memory cells are typically etched into a silicon wafer in a two-dimensional array. In particular, the memory cells are typically arranged into a rectangular grid comprising rows (word lines) and columns (bit lines). The intersection of a row and column constitutes the address of a particular memory cell. Typically, each of the memory cells in the memory array are individually addressable (hence, often referred to as randomly accessible memory) and are capable of storing one bit. The present invention in various embodiments provides a method for constructing a nanotube memory cell that is suitable for use in memory applications, including in randomly accessible memory arrays.

A conventional DRAM memory cell stores binary data in the form of a charge on the memory cell. For example, a logic "0" may be represented by no charge, i.e., a voltage close to zero whereas a logic "1" may be represented by a capacitor voltage close to that of the power supply voltage. In conventional DRAM, a transistor provides access to the capacitor. Selecting the memory cell's word line and its bit line accesses a particular memory cell. For example, when writing, one of the row and the column lines contain the state the capacitor should transition to. When reading, a sense-amplifier determines the level of charge in the capacitor. By raising the voltage of a word line, for example, voltages may be applied to each of the transistor gates, thus causing all of the transistors on the word line to become conductive. As a further result, the storage capacitors of all of the cells in the selected row (word line) are connected to their respective bit lines. A particular state of a memory cell can then be determined (or written to) by monitoring the capacitance at the electrode for the select line, or, for writing to memory, charging the capacitor from the activated select line electrode. Unfortunately, the conventional DRAM configuration as described included storage capacitors that leak charge, thus requiring continual refresh operations for DRAM.

To overcome these problems, a nanotube array and a method for forming the nanotube array is provided. In one embodiment, the present invention provides a two-transistor memory cell to provide access to the individual nanotube memory cells. The nanotube memory cells are configured with nanotube ribbons positioned between an upper electrode and a lower electrode. The nanotube ribbons may be electromechanically switched between two states, i.e., an ON state and an OFF state. That is, the nanotube wire or ribbon suspended between the upper and lower electrodes can be manipulated to be attracted to the electrodes, thus reducing the resistance between the upper and lower electrodes or alternatively, caused to be repelled from the electrodes. Each of these physical states corresponds to an electrical state, i.e., either a logic "1" (attracted) or a logic "0" (repelled). In accordance with one embodiment, the nanotube ribbon actually makes contact with the lower electrode to form a "1" state, and is released to its original position to form a "0" state. It will not make contact with the top electrode in this embodiment.

For each memory cell in this embodiment, four diffusion areas are provided in the substrate with contacts formed to connect to each of the diffusion areas. The diffusion areas form two MOS transistors, with a common gate electrode activating the two transistors. The transistor with the nanotube overlying its contact serves a write/read "W/R" function, whereas the other transistor with contact connected to Nanotube cell top electrode serves an "erase" function.

The present invention in its various embodiments provides low cost, high density, nonvolatile memory cells for use in such an array while offering simplicity in the construction. In fact, the construction includes a minimal number of elements, much like the construction of volatile DRAM cells, but without the refresh schemes required of DRAM.

The integration process described herein provides a method of forming empty, air filled, chambers for placement of the nanotube electromechanical switches, such as those described in U.S. Pat. No. 6,643,165, incorporated by reference herein. The process removes sacrificial materials initially placed in these chambers by forming an access opening to the chamber (i.e., both an upper and lower chamber combined) at a location in the top surface of the chamber distal from the nanotube ribbon. The access opening is used for removal of the sacrificial material and is subsequently plugged concurrently with the formation of a top electrode having direct electrical connection to the underlying contact. Hence, the pathway for removing the sacrificial material is filed without either damaging the nanotubes or metal electrodes or filling the chamber with subsequently deposited passivation materials.

FIGS. 1–5 are diagrams illustrating stages in the formation of a nanotube memory cell in accordance with one embodiment of the present invention. FIG. 1A is a top diagrammatic plan view illustrating a stage in the formation of a nanotube memory cell in accordance with one embodiment of the present invention. FIGS. 1B–1D are cross sectional views illustrating the process stage of FIG. 1A, taken along lines A, B, and C respectively in FIG. 1A. In each of the Figures depicted, as well as in the various views of FIGS. 2–5, like reference numbers refer to like features. It should be further noted that the drawings are illustrative and are not necessarily to scale.

FIG. 1A represents the partially formed device 110 after formation of gate electrodes, source and drain diffusions, and a dielectric layer formed over the patterned gate electrode. These are formed in accordance with conventional techniques and thus full details are believed to be unnecessary here. For example, the formation of the partially formed device illustrated in FIGS. 1A–1D, may commence with the formation of patterned gates 102, 103 formed on a gate dielectric layer 104 disposed on an active region of a semiconductor substrate 100. Process steps for forming gate dielectric layers, and forming and patterning gate electrodes are well known in the art and thus further details will not be provided herein. Next diffusion areas 111, 112, 113, 114, 115, 116, 117, and 118 are formed in the substrate 100. In particular, suitable n-type dopants or p-type dopants are introduced into the substrate. That is, for PMOS devices, p-type dopants such as boron are introduced.

Alternatively, for NMOS devices, n-type dopants such as phosphorus are introduced, typically by ion implantation processes. According to most process flows, the source and drain diffusion areas are created after the formation and patterning of the gate electrode, and lightly doped drain regions (LDD) (not shown), thus forming a self-aligned process. Means of forming source and drain diffusions are well known in the relevant art and therefore will not be described in full detail here. It should be appreciated that many alternative techniques are available for forming the source and drain diffusion areas and the scope of the present invention is intended to embrace all of these.

Next, the diffusion areas 111–118 and the gate electrodes 102, 103 are typically salicided to provide an improved ohmic contact. Salicidation techniques are well known in the relevant art and thus full details will be omitted here. For example, conventional salicidation processes deposit initially low resistance suicides such as $TiSi_2$ or $WiSi_2$ followed by an annealing step. Following the formation of the gate electrodes 102–103, diffusion areas 111–118, and the salicidation of the foregoing, a pre-metal dielectric layer 120 is typically deposited covering the salicided diffusion areas 111–118 and the gate electrodes 102, 103. Any of a number of different dielectric materials may be used to form the PMD layer 120, for example including phosphosilicate glass (PSG) or undoped silicate glass (USG). Next, the pre-metal dielectric layer 120 is patterned and etched to form contact holes 121–128. A contact metal layer, typically comprising tungsten or other refractory metal is then deposited into the contact holes 122–128, typically after depositing a Ti/TiN liner, again in accordance with conventional techniques, and extends to make electrical contact with respective ones of the source and drain diffusions (i.e., 111–118) as described above. The contact metal layer is then typically planarized by chemical mechanical polishing techniques (CMP), thus providing a starting point for the process steps illustrated further in FIGS. 1–5.

Initially, a silicon nitride ($Si_3N_4$) layer 130 is formed on the partially formed device 110. FIGS. 1A–1D show the partially formed device after the planarization of the PMD layer 120 and after the formation of the nitride layer 130 on the planarized surface of the PMD layer 120. Silicon nitride may be formed by any of several conventionally known techniques, including chemical vapor deposition (CVD) and preferably low pressure chemical vapor deposition (LPCVD). Preferably, the $Si_3N_4$ layer 130 has a thickness corresponding to the desired thickness of the lower nanotube memory cell chamber. According to one embodiment, the nitride has a thickness in the range of 200 to 300 Angstroms. The use of $Si_3N_4$ for this layer is intended to be illustrative of an example and not limiting. $Si_3N_4$ provides suitable dielectric insulating characteristics and etching characteristics including selectivity relative to the underlying PMD layer and the overlying nanotube and oxide layers to be described in further detail later. Any dielectric having the predetermined electrical insulation qualities and etching selectivities relative to the overlying and underlying layers is expected to be suitable. Thus, the scope of the invention is intended to extend to a broad range of dielectrics suitable for use in this layer.

Next, the silicon nitride layer 130 is patterned and etched to form a trench between adjoining contacts. Preferably, the etching of the nitride layer 132 is performed using reactive ion etching (RIE). In reactive ion etching, radio frequency radiation is coupled into a low pressure gas to ionize the gas and to produce disassociation of the gas molecules into more reactive species. Typically, the substrate being etched is biased to induce ion bombardment. Anisotropic etching results from the etching of surfaces normal to the direction of ion bombardment at a higher relative rate in comparison to surfaces parallel to the ion bombardment.

The trenches 132 and 134 are thus formed to each overlap a pair of contacts. That is, trench 132 overlaps contacts 123 and 124 whereas trench 134 overlaps contacts 125 and 126. Etching stops on the underlying PMD layer 120, thereby exposing contacts 123, 124 in the first trench 132 and contacts 125, 126 in the second trench. The trenches 132 and 134 described are etched to form a precursor to the lower nanotube chamber. The depth of the nitride layer, and the corresponding depth of the trenches 132, 134 is preferably in the range of 100 to 500 Angstroms, more preferably in the range from 200 to 500 Angstroms, and most preferably in the range from 200 to 300 Anstroms. It should be appreciated that the dimensions of the trench are not limited to this range and that the trench depth is preferably selected to correspond to the final desired dimensions of the nanotube memory cell lower chamber.

As noted, the trenches are formed preferably using an RIE (Reactive Ion Etch) technique, but the invention scope is not so limited. That is, the trenches may be formed by any CMOS compatible process step whereby relative accuracy may be obtained in the trench dimensions. The second trench 134 is depicted for illustration purposes and is not intended to be limiting. That is, it will be appreciated that the formation of the memory cell 110 as depicted in FIGS. 1–5 could be repeated hundreds and even thousands of times across the wafer to form a large memory cell array.

After formation, the trenches 132, 134 are then filled in preparation for formation of the nanotube layer. More specifically, the trenches are preferably filled by an LPCVD Si deposition step. Alternatively, thee trenches could be filled with Si by other process techniques known in the art, for example by sputtering silicon. LPCVD techniques for depositing silicon are known to those of skill in the art and thus further detail is deemed unnecessary here.

After the trenches are completely filled, chemical mechanical planarization (CMP) techniques are used to remove the overburden of the silicon layer resulting in silicon filled trenches 142, 144. FIG. 2A is a top plan view illustrating the partially formed device after filling the trenches 132 and 134 with silicon and after a CMP planarization step.

FIGS. 2B–2C are cross sectional views illustrating the process stage of FIG. 2A, taken along lines A and C respectively in FIG. 2A. Next, as further illustrated in FIG. 2B, which represents a sectional view of the device 110 illustrated in FIG. 2A along sectional line A, the nanotube layer 140 is formed on the planarized surface of the partially formed device. Preferably, the nanotube layer 140 is formed on the nitride layer 130 by spin-on techniques. Alternatively, the nanotube or nanotube ribbon layer may be formed by growing the nanotubes on the partially formed device surface or alternative deposition techniques. Techniques for forming nanotube layers are known to those of skill in the art, for example as disclosed in U.S. Pat. No. 6,643,165 (incorporated by reference herein) and therefore further details are deemed unnecessary here.

Next, as further illustrated in FIG. 2B, the nanotube layer 140 is patterned and etched, preferably using conventional photoresist and photolithography techniques. After etching, the nanotube layer 140 preferably is configured to overlay contacts 123 and 125. It should be noted that the configuration of the nanotube layer 140 is such that contacts 124 and 126 are not covered by the patterned nanotube layer 140. This feature allows for the later etching steps to create openings to allow conductive materials formed in the openings to make electrical contact with the contacts 124 and 126 without also making an electrical connection to the nanotube layer 140. In other words, at this process step, only the sputtered silicon layer 142,144 covers contacts 124, 126 whereas both a nanotube layer 140 and a sputtered silicon layer 142, 144 cover contacts 123, 125. The patterned nanotube layer preferably extends from a point overlying gate 102 to a point overlying gate 103. This enables the patterned nanotube layer to be pinned at its extremities between the underlying nitride layer 130 and the overlying oxide layer 146 (See FIG. 3). Pinning is also provided by these layers between the nanotube memory cells. Preferably, the nanotube layer will have a length, i.e., the distance between the pinnings (as shown in FIG. 2B), of 1000 to 1500 nm.

FIG. 3A is a top diagrammatic plan view illustrating another stage in the formation of a nanotube memory cell in accordance with one embodiment of the present invention. FIGS. 3B–3C are cross sectional views illustrating the process stage of FIG. 3A, taken along lines A and C respectively in FIG. 3A. As illustrated in FIG. 3A, the upper nanotube chamber is next formed. First, an oxide layer 146 is formed on the surface of the partially formed device. Preferably, the oxide 146 is formed by Low Pressure Chemical Vapor Deposition (LPCVD) techniques resulting in a relatively thin layer. Preferably, the oxide has a thickness in the range of 100 to 500 Angstroms, more preferably 200 to 500 Angstroms, and most preferably 200 to 300 Angstroms. More specifically, it is preferred that the oxide layer 146 will have a thickness approximating the thickness of the nitride layer 130 underlying the nanotube layer 140 so that the final memory cell structure will have an upper chamber of approximately the same height as its lower chamber. The description of the layer as an oxide layer is illustrative and not intended to be limiting. That is, any dielectric layer may be substituted for the oxide layer provided that the dielectric provides suitable insulating characteristics and etching selectivities to the underlying dielectric layer, e.g. the nitride layer 130. Next, the oxide layer 146 is patterned using conventional photolithography techniques and etched using wet-etch chemistry (such as HF) to form trenches 148,149, each constituting a precursor to the nanotube memory cell upper chamber.

In similar ways to the formation of the trenches 132, 134, silicon is sputtered to fill trenches 148,149. Next, the silicon layer is planarized, preferably by CMP techniques. The partially formed device illustrated in FIG. 3B shows the results of the planarization step to form the silicon filled upper chamber. In particular, the trench 148 overlying contacts 123 and 124 and a similar trench 149 overlying contacts 125 and 126 are then filled with silicon, preferably using a sputtering technique. The silicon is polished back using CMP techniques to form a planarized surface defining in part the top of the nanotube memory cell upper chamber.

FIG. 4A is a top diagrammatic plan view illustrating another stage in the formation of a nanotube memory cell in accordance with one embodiment of the present invention. FIGS. 4B–4D are cross sectional views illustrating the process stage of FIG. 4A, taken along lines A, B, and C respectively in FIG. 4A, each formed in accordance with one embodiment of the present invention.

The process proceeds as illustrated in FIG. 4B with the formation of a nitride layer 152 on the exposed oxide layer 146 and silicon trenches 148,149. The nitride layer 152 is preferably formed by conventional deposition techniques, for example by CVD process steps. In order to provide access to the nanotube layer to provide external electrical contact, an access opening 156 is etched in an area overlying the nanotube layer 140. Further, an access hole 158 is provided overlying contact 124 (and a second access hole 159 over contact 126) in order to provide an opening in the nitride layer for etching of the upper and lower chambers of the respective nanotube memory cells. That is, patterning of the nitride layer 142 is performed using conventional photolithography and photoresist layers and etched layer 142 using RIE etch, for all access openings 156, and 158–159. A wet etch process is then performed to remove oxide (layer 146) in access opening 156.

Considerable latitude is given in the alignment of the upper chamber and the lower chamber and their relative sizes. That is, the upper chamber so defined can have the same size as the bottom chamber since etching to form contact holes for electrical connection with contacts 124 and 126 occurs outside of the nanotube layer 140.

FIG. 5A is a top diagrammatic plan view illustrating another stage in the formation of a nanotube memory cell in accordance with one embodiment of the present invention.

FIGS. 5B–5D are cross sectional views illustrating the process stage of FIG. 5A, taken along lines A, B, and C respectively in FIG. 5A, each formed in accordance with one embodiment of the present invention.

Further, as illustrated in FIG. 5C, the wet etching is used to tunnel through access holes 158, 159 to evacuate the silicon from the upper chamber 148 and lower chambers 132. FIG. 5C shows the upper and lower chambers after evacuation, i.e., an air filled chamber 160 having a nanotube layer 140 at its midpoint. Preferably, the wet etching is performed using tetramethyl ammonium hydroxide (TMAH). By using a wet etch, the nanotube cell chambers may be formed through the access openings described above. Since the depth of the access holes 152 and 154 are shallow, i.e., about ~400 Angstroms, the metal subsequently deposited fills the chamber only in the section overlying the contacts 124 and 126 without filling the rest of the chamber 160. Preferably, the second contact 124 in the pair is located at a predetermined distance from the first contact 123 that is a function of the flow properties of the conductive material selected for filling the contact hole. In other words, the contact 124 is located at a sufficient distance form the first contact 123 such that the conductive material deposited into the openings 158, 159 will not flow and fill the upper and lower chambers to the degree that the movement of the nanotube layer 140 is inhibited.

After the silicon in the trenches 132, 134, 148, and 149 is evacuated by etching and the resulting NT cell chamber 160 formed, the metal contacts are formed.

FIG. 6A is a top diagrammatic plan view illustrating another stage in the formation of a nanotube memory cell in accordance with one embodiment of the present invention. FIGS. 6B–6D are cross sectional views illustrating the process stage of FIG. 6A, taken along lines A, B, and C respectively in FIG. 6A, each formed in accordance with one embodiment of the present invention.

As illustrated in FIG. 6A, a metal electrode 164 is connected to the nanotube layer. Also shown are interconnects 166 and 167, connected respectively to the top electrodes of the first and second nanotube memory cells. Preferably, the metal layers are formed by Physical Vapor Deposition (PVD) techniques. Preferably, a metal stack comprising Ti/TiN/Al/TiN is deposited by conventional techniques known to those of skill in the relevant art. That is, a first Ti or TiN film is used to line the access openings 156, 158, and 159 followed by deposition of the contact metal such as Al. After a conventional CMP is used to planarize the surface of the conductive metal (e.g. Al), the process flow proceeds with conventional patterning of the Al to form local interconnects 164, 166 and 167. In specific, local interconnect 164 provides electrical connection to the nanotube layer 140. Local interconnects 166 and 167 provide electrical connection to the top electrode respectively of nanotube memory cells 612 and 614. Ti/TiN/Al/TiN is a standard metal stack and the top TiN layer usually serves an anti-reflection function for lithography steps.

Finally, a passivation layer such as an oxide formed by conventional means such as CVD is deposited over the device to protect the exposed metal interconnects 164, 166 and 167. Contact to the gates 102 and to contacts 121 and 122 may be effectuated by various methods understood or realizable by those of skill in the art with minimal experimentation. For example, in one embodiment, a via layer may be formed to provide connection to these contacts.

All the process steps in this integration flow have been proven in manufacturing environment. By using the techniques described, Al may be used as a top electrode conductor. Al has much lower resistivity compared to refractor metals such as W used in known techniques, hence thin metal lines can be used to conduct the current required for operation of the memory array. This is important since high aspect-ratio metal lines typically required when using refractory metals will cause gap-fill problems in oxide deposition steps that follow the formation of the nanotube memory cells. Moreover, the techniques of the described embodiments eliminate the $SiO_2$ sputtering process, which is not feasible for manufacturing on large-size wafers. Finally, using the conductive metal (i.e., Al) to fill the nanotube chamber access holes provides a reliable proves for sealing her nanotube chambers that eliminates concerns over contaminating the chamber from dielectric materials used to seal the access holes.

Although the foregoing invention has been described in some detail for purposes of clarity of understanding, it will be apparent that certain changes and modifications may be practiced within the scope of the appended claims.

Accordingly, the present embodiments are to be considered as illustrative and not restrictive, and the invention is not to be limited to the details given herein, but may be modified within the scope and equivalents of the appended claims.

What is claimed is:

1. A method of forming a nanotube memory cell on a semiconductor substrate, the method comprising:
   forming a first silicon filled chamber overlying a first and second contact formed in the substrate;
   forming a nanotube layer on the first silicon filled chamber, the nanotube layer overlying the first contact and not overlying a second portion of the first silicon filled chamber, the second portion overlying the second contact;
   forming a second silicon filled chamber directly on the nanotube layer;
   forming a dielectric layer on the second silicon filled chamber;
   patterning the dielectric layer to form an access contact hole exposing the second silicon filled chamber, the contact hole formed to overlay the second portion of the first chamber;
   etching the first and second silicon filled chambers using the contact hole to remove the silicon; and
   depositing a conductive material on the dielectric layer such that the conductive material makes contact with the second contact and closes the aperture created by the contact hole.

2. The method as recited in claim 1, wherein the dielectric layer is a nitride layer.

3. The method as recited in claim 1, wherein forming the first silicon filled chamber comprises depositing a nitride layer on the substrate and patterning and etching the nitride layer to form a trench overlying the first and second contacts.

4. The method as recited in claim 1, wherein forming the second silicon filled chamber comprises depositing an oxide layer on the nanotube layer and patterning and etching the oxide layer to form a trench overlying the first and second contacts.

5. The method as recited in claim 1, wherein the contact hole is positioned over the second contact.

6. The method as recited in claim 1, wherein the second contact is located a predetermined distance from the first contact, the predetermined distance being a function of the flow properties of the conductive material selected for filling the contact hole.

7. The method as recited in claim 1, wherein the first and second contacts provide electrical contact with a first and second diffusion area on the substrate.

8. The method as recited in claim 1, wherein patterning the dielectric layer further comprises exposing the nanotube layer and wherein depositing a conductive material on the dielectric layer further comprises making electrical contact between the exposed nanotube layer and the conductive metal.

9. The method as recited in claim 3, wherein the contact hole is formed to access the second trench at a location distal from the first contact.

10. The method as recited in claim 1, wherein etching the first and second silicon filled chambers is performed using N-methylpyrrolidinone (NMP) as an etching solvent.

11. The method as recited in claim 1, further comprising patterning and etching the conductive layer to form an upper electrode and a contact electrically connected to the nanotube layer.

12. The method as recited in claim 1, wherein the first silicon filled chamber has a thickness in the range of 10 to 50 nm.

13. The method as recited in claim 1, wherein the second silicon filled chamber has a thickness in the range of 10 to 50 nm.

14. The method as recited in claim 1, wherein forming the first silicon filled chamber comprises depositing a nitride layer on the substrate and patterning and etching the nitride layer to form a trench overlying the first and second contacts and wherein forming the second silicon filled chamber comprises depositing an oxide layer on the nanotube layer and patterning and etching the oxide layer to form a trench overlying the first and second contacts.

15. The method as recited in claim 1, wherein the first silicon filled chamber is approximately the same size as the second silicon filled chamber.

16. A method of forming a nanotube memory cell on a semiconductor substrate, the method comprising:
    forming a first trench overlying a first and second contact formed in a nitride layer;
    filling the first trench with silicon to form a memory cell lower chamber;
    forming a patterned nanotube layer over the memory cell lower chamber, the nanotube layer patterned such that the portion of the lower chamber overlying the second contact is exposed;
    forming a second trench on the nanotube layer such that the second trench overlies the first and second contact;
    filling the second trench with silicon to form a memory cell upper chamber;
    depositing and patterning a nitride layer over the upper and lower chambers to form an access opening to the nanotube layer and a second access opening to the second contact; and
    depositing and patterning a conductive layer to form an upper electrode electrically connected to the second contact.

17. The method as recited in claim 16, wherein the first contact forms a bottom electrode of the memory cell.

\* \* \* \* \*